(12) United States Patent
Jiang et al.

(10) Patent No.: US 9,425,149 B1
(45) Date of Patent: Aug. 23, 2016

(54) INTEGRATED CIRCUIT PACKAGE ROUTING WITH REDUCED CROSSTALK

(71) Applicant: Altera Corporation, San Jose, CA (US)

(72) Inventors: Xiaohong Jiang, San Jose, CA (US); Jianming Huang, San Jose, CA (US); Hong Shi, San Jose, CA (US); Jianmin Zhang, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 1 day.

(21) Appl. No.: 14/088,094

(22) Filed: Nov. 22, 2013

(51) Int. Cl.
- *H01L 23/52* (2006.01)
- *H01L 23/538* (2006.01)
- *H01L 23/00* (2006.01)
- *H01L 23/48* (2006.01)
- *H01L 23/528* (2006.01)

(52) U.S. Cl.
CPC .......... *H01L 23/5384* (2013.01); *H01L 23/481* (2013.01); *H01L 23/5286* (2013.01); *H01L 24/14* (2013.01)

(58) Field of Classification Search
CPC ... H01L 23/481; H01L 23/5384; H01L 24/18; H01L 24/20
See application file for complete search history.

(56) References Cited

U.S. PATENT DOCUMENTS

| | | | |
|---|---|---|---|
| 6,570,448 B1 | 5/2003 | Sobel | |
| 6,641,411 B1 * | 11/2003 | Stoddard et al. | 439/108 |
| 6,653,901 B2 | 11/2003 | Sobel | |
| 6,891,434 B2 | 5/2005 | Sobel | |
| 7,061,318 B2 | 6/2006 | Sobel | |
| 7,239,526 B1 * | 7/2007 | Bibee | H05K 1/0219 361/788 |
| 7,671,273 B2 * | 3/2010 | Douriet et al. | 174/33 |
| 7,976,540 B2 | 7/2011 | Daw et al. | |
| 8,133,218 B2 | 3/2012 | Daw et al. | |
| 8,231,615 B2 | 7/2012 | Daw et al. | |
| 2004/0026797 A1 * | 2/2004 | Chen | H01L 23/50 257/786 |
| 2006/0266549 A1 * | 11/2006 | Lin et al. | 174/262 |
| 2010/0071940 A1 * | 3/2010 | Ejiri et al. | 174/257 |
| 2011/0007487 A1 * | 1/2011 | Muraoka | 361/760 |
| 2011/0203843 A1 * | 8/2011 | Kushta | 174/377 |
| 2011/0242713 A1 | 10/2011 | Dalmia et al. | |
| 2012/0200303 A1 * | 8/2012 | Guo | G01R 31/3004 324/613 |
| 2012/0237012 A1 | 9/2012 | Fang et al. | |
| 2013/0330941 A1 * | 12/2013 | Jeon | H01R 12/585 439/65 |
| 2014/0014404 A1 * | 1/2014 | Hinton et al. | 174/261 |

FOREIGN PATENT DOCUMENTS

CN 102711362 A * 10/2012 ........... H05K 1/0222

* cited by examiner

*Primary Examiner* — Michele Fan
(74) *Attorney, Agent, or Firm* — Treyz Law Group; Jason Tsai

(57) ABSTRACT

An integrated circuit package substrate may include a core layer and dielectric layers formed on top and bottom surfaces of the core layer. Routing traces such as stripline structures may be formed in some of the dielectric layers, whereas plated through hole (PTH) structures may be formed through the core layer. A first pair of PTHs that carry a first differential signal may be orthogonally intertwined with a second pair of PTHs that carry a second differential signal. Solder balls formed at the surface of the package substrate may include a first pair of solder balls that convey a first differential signal that is orthogonally intertwined with respect to a second pair of solder balls that convey a second differential signal. The package substrate may be mounted on a printed circuit board (PCB). Differential PCB vias could use the same BGA orthogonal pattern described above.

11 Claims, 7 Drawing Sheets

INTEGRATED CIRCUIT PACKAGE ROUTING WITH REDUCED CROSSTALK

BACKGROUND

An integrated circuit (IC) package includes, among others, a substrate and a die placed on the substrate. The die is generally coupled to the substrate through wire bonds or solder bumps. Signals from the integrated circuit die may then travel through routing traces in the package substrate and then through second-level solder joints such as BGA (Ball Grid Array) or LGA (Land Grid Array) to external circuitry.

In integrated circuits that are used to carry out high speed and high density data transmissions, signals that are simultaneously toggling on neighboring routing traces may experience performance degradation due to undesired cross-coupling between each pair of adjacent routing traces. In an effort to reduce channel crosstalk in such scenarios, integrated circuit package designers have focused on isolating the routing traces by (i) physically increasing the distance between critical pairs of traces, (ii) inserting ground planes between pairs of traces, or (iii) routing transmit/receive channels on different package substrate layers.

In most integrated circuit package designs, however, once the package size is defined (i.e., once the horizontal surface dimension is defined), although there is flexibility with respect to reducing horizontal crosstalk through further separation of pairs of traces potentially at the cost of adding substrate layers, reducing vertical crosstalk becomes a bottleneck. As a result, it may be desirable to provide other ways of further reducing channel crosstalk.

SUMMARY

This relates generally to integrated circuits and, more particularly, to conductive structures for routing signals to and from an integrated circuit package.

In accordance with an embodiment, an integrated circuit package may include a first pair of conductive via structures that carries a first differential user signal, a second pair of conductive via structures that carries a second differential user signal, where the first and second pairs of conductive via structures are orthogonally intertwined. The first and second pairs of conductive via structures may be plated through hole (PTH) via structures formed through a core layer in the package substrate (e.g., a substrate on which one or more integrated circuit dies in the integrated circuit package may be mounted). In particular, the first and second pairs of PTHs may be arranged in a square. The first pair of PTHs may be formed at first and second diagonally opposing corners in the square, whereas the second pair of PTHs may be formed at third and fourth diagonally opposing corners in the square.

In accordance with another embodiment, an integrated circuit package may include an array of solder balls formed at the bottom of the package substrate, where at least first and second solder balls in the array serve to convey a first differential signal and where at least third and fourth solder balls in the array serve to convey a second differential signal. The first, second, third, and fourth solder balls may be arranged in a square, where the first and second solder balls are diagonally across from each other in the square, and where the third and fourth solder balls are diagonally across from each other in the square. A group of ground or power supply voltage conducting solder balls may surround the four differential signal conducting solder balls.

In accordance with another embodiment, an integrated circuit package may be mounted on a printed circuit board. A regular array of solder balls may be formed between the integrated circuit package and the printed circuit board. The printed circuit board may include first conductive vias that carry a first differential signal, second conductive vias that carry a second differential signal, third conductive vias that surround the first and second conductive vias and that serve as ground return paths for the first and second conductive vias, and an additional shielding via that is interposed between the first and second conductive vias. The additional shielding via may be electrically shorted to the third conductive vias.

In particular, the first, second, and third conductive vias may be aligned to corresponding solder balls in the array (e.g., each of the first, second, and third conductive vias may make direct vertical contact with a respective solder ball through ball pads, which is also called via on pad), whereas the additional shielding via may be offset from the solder balls (e.g., the additional shielding via does not make direct vertical contact with any of the solder balls). The first and second differential signal conducting vias in the printed circuit board may traverse a first number of routing layers, whereas the additional shielding via may only traverse a second number of routing layers that is less than the first number so that the additional shielding via does not interfere with the PCB signal routing.

Further features of the present invention, its nature and various advantages will be more apparent from the accompanying drawings and the following detailed description.

DETAILED DESCRIPTION

Embodiments of the present invention relate to integrated circuits and, more particularly, to integrated circuit packages.

An integrated circuit package may include a substrate on which at least one integrated circuit is mounted. In some applications, integrated circuits may output high-speed signals that are conveyed to external circuitry via transmission line paths formed in the package. Conventional package substrates are formed in a way that limits the high-speed performance of the transmission line paths. It will be recognized by one skilled in the art that the present exemplary embodiments may be practiced without some or all of these specific details.

In other instances, well-known operations have not been described in detail in order not to unnecessarily obscure the present embodiments.

Figure 1:
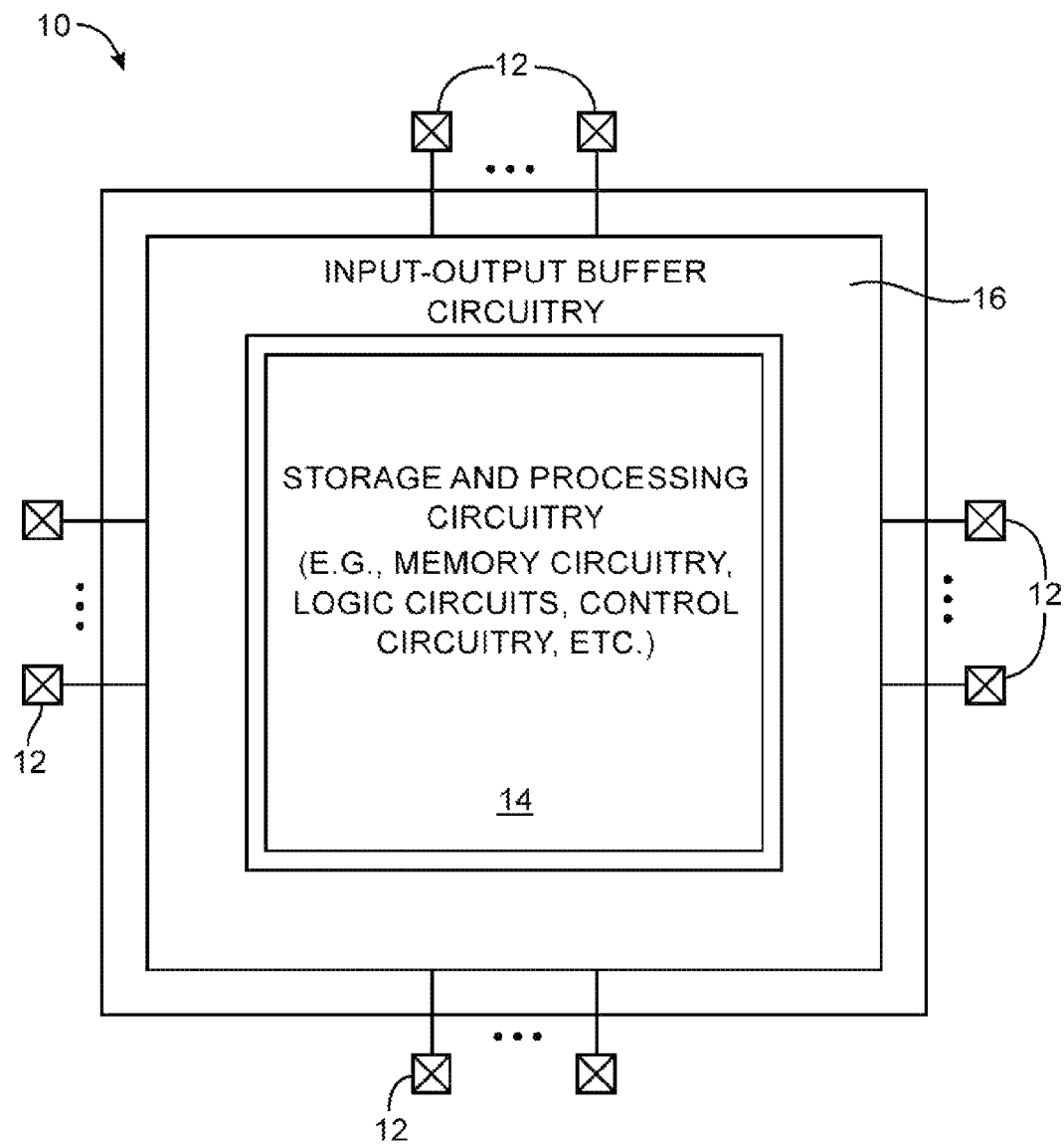
FIG. 1 is a diagram of an illustrative integrated circuit with input-output buffer circuitry in accordance with an embodiment of the present invention.

FIG. 1 shows an integrated circuit 10 that includes internal circuitry such as storage and processing circuitry 14. Integrated circuit 10 may be a memory chip, a digital signal processor (DSP), a microprocessor, an application specific integrated circuit (ASIC), or a programmable integrated circuit. Examples of programmable integrated circuits include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few. Storage and processing circuitry 14 may include memory circuitry, logic circuits, arithmetic circuits, and/or other (digital or analog) control circuitry that serve to implement the desired function of integrated circuit 10.

As shown in FIG. 1, device 10 may include input-output (I/O) circuitry such as I/O buffer circuitry 16 formed along each edge of device 10. Circuitry 16 may be used for driving signals off of device 10 and for receiving signals from other devices via I/O pins 12. For example, input-output buffer circuitry 16 may include output buffer circuits for driving signals off of device 10 to external circuitry and may include input buffer circuits for receiving signals from the external circuitry.

Figure 2:
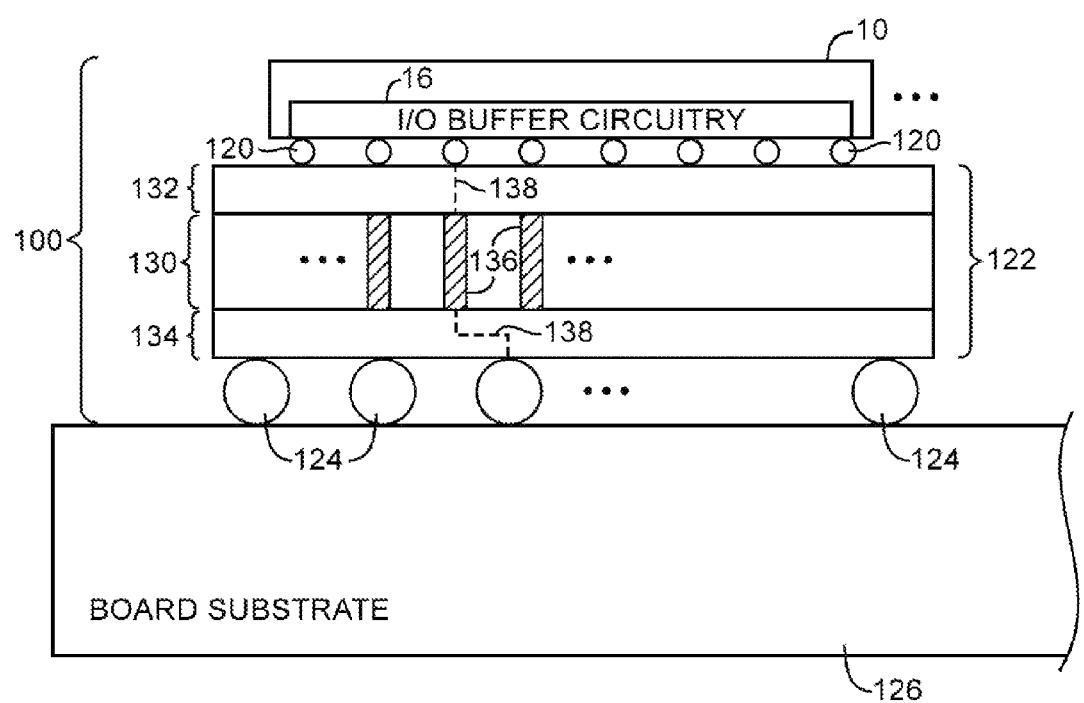
FIG. 2 is a cross-sectional side view of an illustrative integrated circuit package in accordance with an embodiment of the present invention.

Integrated circuit dies are often contained within an integrated circuit package. FIG. 2 is a cross-sectional side view of an illustrative integrated circuit (IC) package 100. As shown in FIG. 2, package 100 may include a package substrate such as package substrate 122 and at least one integrated circuit die 10 mounted on top of package substrate 122. This single-chip package configuration is merely illustrative. If desired, package 100 may include multiple integrated circuit dies mounted laterally with respect to one another on top of package substrate 122 and/or multiple integrated circuit dies stacked vertically with respect to one another over package substrate 122. In general, a multichip package may include any number of dies stacked on top of one another and dies arranged laterally with respect to one another. In such multichip package configurations, an interposer structure may be formed between the package substrate and the associated dies.

Referring still to FIG. 2, package substrate 122 may be coupled to board substrate 126 via solder balls 124. As an example, solder balls 124 may form a ball grid array (BGA) configuration for interfacing with corresponding conductive pads on substrate 126. Substrate 126 may be a printed circuit board (PCB), a flexible printed circuit board (e.g., a "flex circuit"), or other types of substrates formed from plastic, glass, ceramic, fiberglass-filled epoxy, or a combination of these materials.

Die 10 may be formed using a semiconductor substrate (e.g., a p-type silicon substrate) having a first surface, a second surface, and interconnect layers formed on the first surface of the die substrate. Device structures such as transistor gate structures, capacitor plate structures, resistive load structures, density-compliance structures, and other device structures (e.g., I/O buffer circuitry 16) may be formed at the interface where the interconnect layers meet the first surface of the die substrate. The interconnect layers are sometimes referred to collectively as a dielectric stack.

The first surface on which the dielectric stack formed is typically referred to as the "front" surface of the die substrate. The configuration as shown in FIG. 2 in which the front/upper surface is facing downwards towards package substrate 122 is therefore sometimes referred to as a "flip-chip" configuration, because die 10 is inverted/flipped from its upright orientation.

Die 10 may be coupled to package substrate 122 via flip-chip bumps 120. Bumps 120 may refer to solder bumps that are formed on the uppermost layer of the dielectric stack (e.g., bumps 120 may be deposited on aluminum pads that are formed at the uppermost layer of the dielectric stack). Bumps 120 that interface directly with package substrate 122 may sometimes be referred to as controlled collapse chip connection (C4) bumps and may each have a diameter of 100 μm (as an example).

Package substrate 122 may include a substrate carrier (or "core") layer such as layer 130 having a top surface and a bottom surface, a first set of interconnect routing layers 132 formed on the top surface of layer 130, and a second set of interconnect routing layers 134 formed on the bottom surface of layer 130. Routing layers 132 and 134 may include metal routing paths formed through dielectric material and may sometimes be referred to as "redistribution" layers. Conductive via structures 136 sometimes referred to as plated through holes (PTH) may be formed through layer 130 (e.g., PTH structures 136 may extend from the upper surface of layer 130 to the lower surface of layer 130).

In the example of FIG. 2, a signal routing path such as signal routing path 138 may be formed in package substrate 122 for connecting flip-chip bumps 120 to solder balls 124. Signals output from I/O buffer circuitry 16 may be driven off of device 10 through C4 bump(s) 120, package routing path(s) 138 (and PTH 136), and solder ball(s) 124 in that general order to other circuitry on or coupled to board 126. Signals arriving from other external circuitry may be conveyed through solder ball(s) 124, signal routing path(s) 138 (and PTH 136), and C4 bump(s) 120 in that general order and may be received using I/O buffer circuitry 16.

Signal routing paths 138 formed in redistribution layers 132 and 134 may be transmission line structures that are formed using one or more microstrip transmission lines, stripline transmission lines, edge-coupled microstrip transmission lines, edge-coupled stripline transmission lines, or other suitable transmission line structures. Transmission line structures such as the stripline structure provides good isolation between adjacent traces (compared to the microstrip arrangement) and is therefore suitable for use in supporting high-speed data transmission (e.g., the stripline transmission line medium may be used for routing signals in high-speed channels with data rates of more than 10 Gbps, more than 20 Gbps, more than 30 Gbps, etc.).

The high-speed channels on device 10 are typically formed using differential signal traces that carry differential user signals. For example, a transmit channel may include a first pair of differential signal traces carrying a first differential user signal, whereas a receive channel may include a second pair of differential signal traces carrying a second differential user signal. In general, it is desirable to suppress signal crosstalk between different channels. For example, if a first pair of differential signal traces is placed too close to a second pair of differential signal traces, the cross-coupling between the two pairs of differential traces may result in an unacceptable amount of degradation in signal performance.

In conventional integrated circuit packages, differential channels are merely physically separated from one another to reduce crosstalk. As an example of vertical crosstalk in PTHs or BGAs, a first differential pair may be surrounded by a first group of individual ground vias or balls at a first location in the package, whereas a second differential pair may be surrounded by a second group of individual ground vias or balls at a second location in the package. Physical separation of these PTHs or BGA balls however are constrained by the package size, and can only provide limited reduction in crosstalk.

Figure 3:
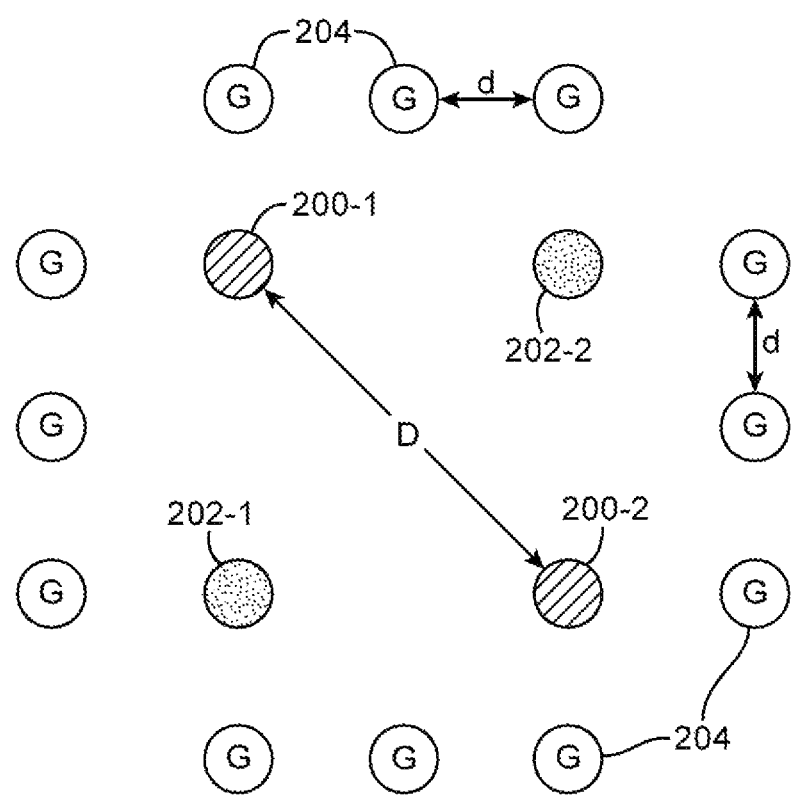
FIG. 3 is a diagram showing an illustrative package plated through hole (PTH) orthogonal arrangement in accordance with an embodiment of the present invention.

In one suitable arrangement, the plated through hole structures 136 in package substrate 122 may be formed in a pattern shown in FIG. 3. As shown in FIG. 3, PTH via structures 200-1 and 200-2 may be used for routing a first pair of differential signals, whereas PTH structures 202-1 and 202-2 may be used for routing a second pair of differential signals. For example, vias 200-1 and 200-2 may be used to convey user signals in a transmit channel, whereas vias 202-1 and 202-2 may be used to convey user signals in an associated receive channel. Ground PTH structures 204 (e.g., PTHs 204 that serve as return paths for the differential signals) may be formed in substrate 122 to surround PTH structures 200-1, 200-2, 202-1, and 202-2.

The first signal pair (e.g., PTHs 200-1 and 200-2) and the second signal pair (e.g., PTHs 202-1 and 202-2) may be formed in a square layout in which each of PTHs 200-1, 200-2, 202-1, and 202-2 are formed at the four corners of the square, where 200-1 and 200-2 are located diagonally across from each other in the square, and where 202-1 and 202-2 are located diagonally opposed from one another in the square. If desired, the first and second signal pairs may be arranged in a rectangular, a parallelogram, or other suitable shapes (when viewed from above) that has diagonal lines orthogonal one to another. In particular, the ground PTHs 204 may be separated by a standard PTH "pitch" (or distance) d. The differential signal traces, however, need not be separated by the standard PTH pitch d. As shown in FIG. 3, PTHs 200-1 and 200-2 may be separated by a diagonal distance D that is greater than d, that is greater than $d*\sqrt{2}$, that is at least greater than $2*d$, etc. Similarly, PTHs 202-1 and 202-2 may be separated by a diagonal distance that is greater than d, that is greater than $d*\sqrt{2}$, that is at least greater than $2*d$, etc. For best performance, the PTHs associated with each signal pair should be separated from each other by the same diagonal distance D.

Figure 4:
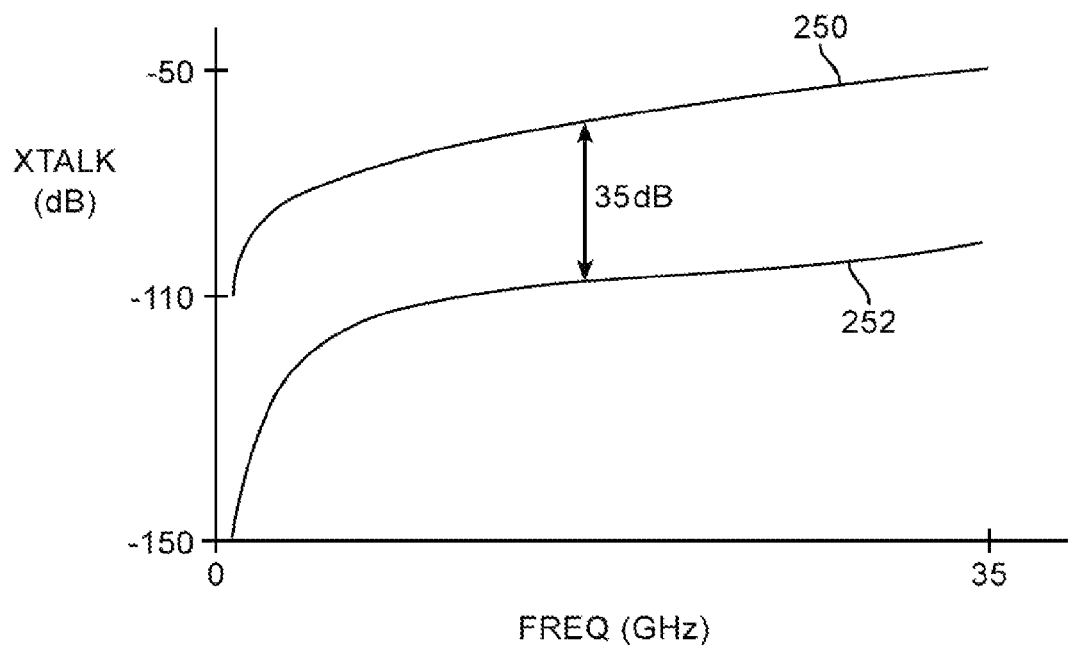
FIG. 4 is a plot illustrating how the orthogonal arrangement of FIG. 3 reduces channel crosstalk in accordance with an embodiment of the present invention.

Formed in this way, the first signal pair may be referred to as being "orthogonally" intertwined with respect to the second signal pair. This routing arrangement results in a symmetric pattern for the intertwined differential channels, which substantially reduces cross-coupling and noise due to the orthogonal electromagnetic field distributions. FIG. 4 illustrates how crosstalk can be reduced using the orthogonal PTH arrangement of FIG. 3. Characteristic curve 250 represents the amount of crosstalk as a function of frequency between two adjacent pairs of differential channels that are merely isolated using traditional interposing ground vias. Characteristic curve 252 may represent the amount of crosstalk as a function of frequency between two pairs of differential channel that are orthogonally intertwined with each other using the arrangement of FIG. 3. As shown in FIG. 4, the amount of crosstalk associated with curve 252 may be 35 dB less than the amount of crosstalk associated with curve 250. In other words, the level of crosstalk between nearby channels can be substantially reduced using the orthogonal routing arrangement of FIG. 3.

Figure 5:
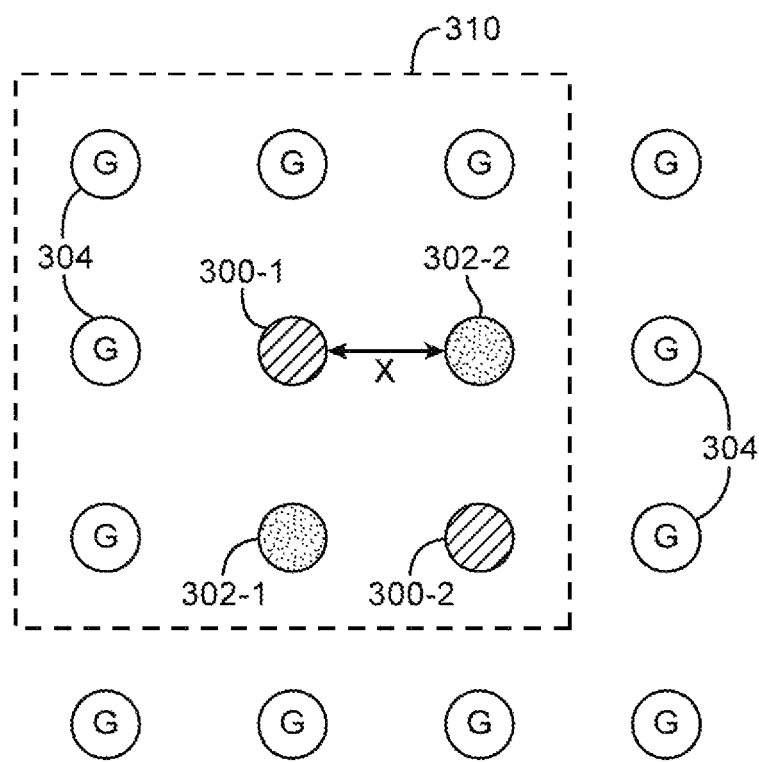
FIG. 5 is a diagram showing an illustrative ball grid array (BGA) orthogonal arrangement in accordance with an embodiment of the present invention.

In another suitable arrangement, the solder balls (e.g., solder balls 124 in FIG. 2) at the interface between package substrate 122 and PCB 126 may be formed in a pattern shown in FIG. 5. Unlike the formation of the plated through holes of FIG. 3, solder balls 124 have to be formed according to a regular ball grid array (BGA) configuration (e.g., a configuration in which each solder ball 124 is spaced from an adjacent solder ball by a predetermined BGA pitch X).

As shown in FIG. 5, solder balls 300-1 and 300-2 (and corresponding solder pads formed on PCB 126) may be used for routing a first pair of differential signals, whereas solder balls 302-1 and 302-2 (and corresponding solder pads formed on PCB 126) may be used for routing a second pair of differential signals. As an example, solder balls 300-1 and 300-2 may be used to convey signals in a first receive channel, whereas solder balls 302-1 and 302-2 may be used to convey signals in a second receive channel. Ground solder balls 304 may be formed to surround high-speed signal conducting solder balls 300-1, 300-2, 302-1, and 302-2.

The first signal pair (e.g., solder balls 300-1 and 300-2) and the second signal pair (e.g., solder balls 302-1 and 302-2) may be formed in a square layout in which each of solder balls 300-1, 300-2, 302-1, and 302-2 are formed at the four corners of the square, where 300-1 and 300-2 are located diagonally opposed from each other in the square, and where 302-1 and 302-2 are located diagonally opposed from one another in the square (when viewed from above). If desired, the first and second signal pairs may be arranged in a rectangle, a parallelogram, or other suitable shapes.

The first solder ball pair may sometimes be referred to as being orthogonally patterned with respect to the second solder ball pair. This routing arrangement results in a symmetric pattern, which substantially reduces cross-coupling and noise for signals that are being routed to and from package 100. The dotted box 310 in FIG. 5 represents a BGA pattern that can be repeated as many times as desired to implement differential signal routing with improved crosstalk at the interface between PCB 126 and package substrate 122 that is mounted on PCB 126. The same pattern can be implemented not only in package BGA arrangements, but also in the PCB via arrangements. It can be implemented in via on pads (e.g., a via drilled right underneath the ball pads) in PCB design to dramatically reduce PCB via cross talk.

Figure 6:
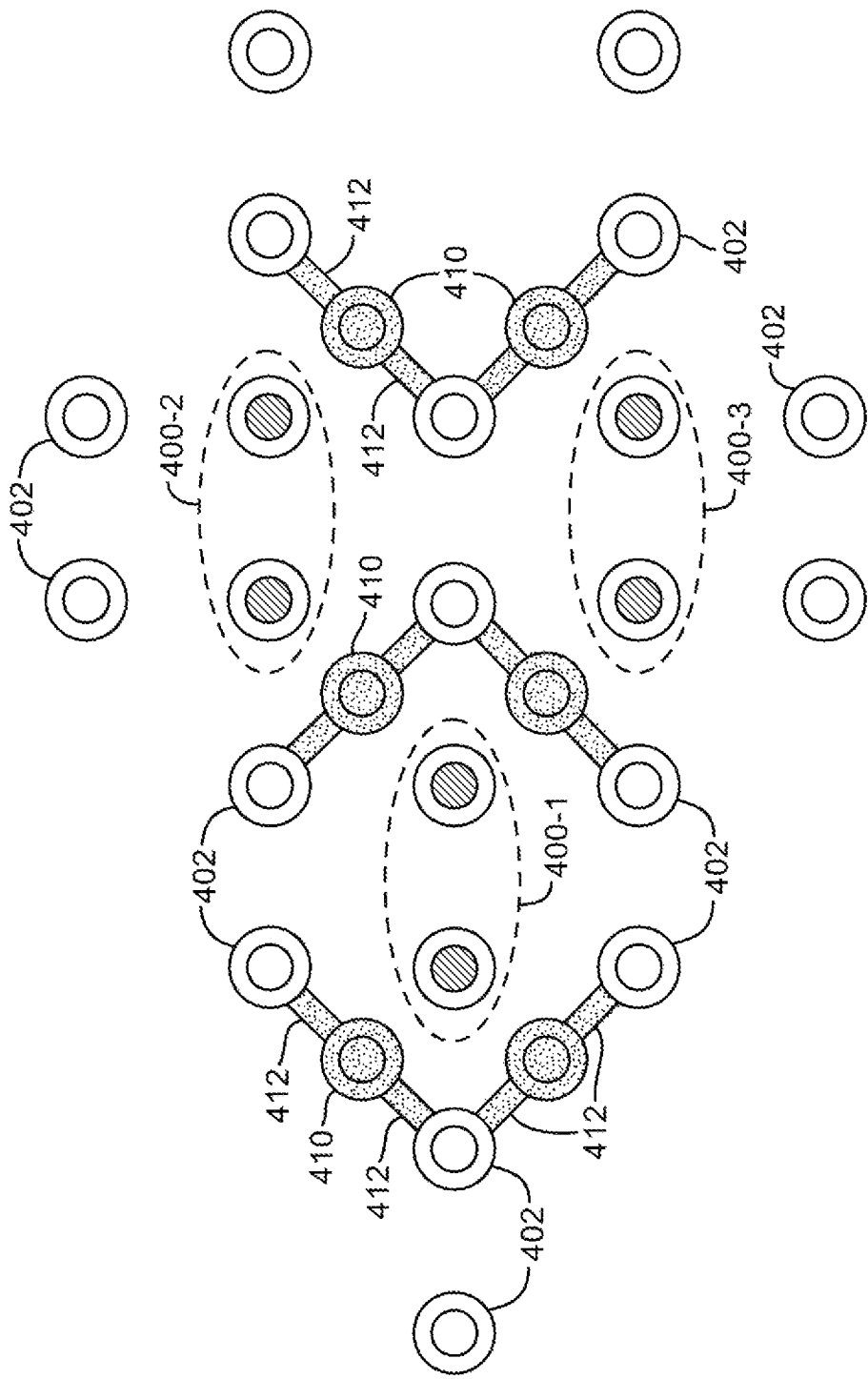
FIG. 6 is a diagram showing illustrative inserted ground isolation vias in a printed circuit board (PCB) in accordance with an embodiment of the present invention.

In another suitable arrangement, conductive via structures formed in PCB substrate 126, at least some of which are used to contact solder balls 124, may be formed in a pattern shown in FIG. 6. Similar to the formation of the solder balls of FIG. 5, the via structures that directly contact the solder balls have to be formed according to the regular BGA pattern.

As shown in FIG. 6, PCB 126 may include conductive via structures 400-1 (e.g., vias for conveying a first differential signal), via structures 400-2 (e.g., vias for conveying a second differential signal), via structures 400-3 (e.g., vias for conveying a third differential signal), ground via structures 402 (e.g., vias through which ground return paths are provided), and additional shielding via structures 410 which have been inserted to provide improved channel isolation.

While the signal conducting vias (e.g., via pairs 400-1, 400-2, and 400-3) and the ground vias 402 may be vertically aligned with and may make direct vertical contact with corresponding solder balls 124, the additional shielding via structures 410 does not make direct vertical contact with any of solder balls 124 (e.g., shielding via structures 410 are vertically offset from solder balls 124). In other words, shielding vias 410 need not be formed according to the regular BGA pattern and can be inserted in areas of PCB 126 between adjacent channels. Vias 410 may therefore sometimes be referred to as "dummy" shielding vias. Shielding vias 410 may also be shorted to neighboring grounding vias 402 through path 412.

The use of inserted shielding vias need not be used with differential solder ball pairs 124 formed in the orthogonal square pattern. In the example of FIG. 6, receive signal pair 400-1 corresponding to solder balls formed at a first location on PCB 126 and transmit signal pair 400-2 corresponding to solder balls formed at a second location on PCB 126 may be isolated by at least two neighboring grounding vias 402 that are directly shorted by an interposing shielding via 410 to reduce crosstalk. Similarly, receive signal pair 400-1 and another transmit signal pair 400-3 corresponding to solder balls formed at a third location on PCB 126 may be isolated by yet another two neighboring grounding vias 402 that are directly shorted by an interposing shielding via 410.

In general, the additional shielding vias 410 should be inserted between two diagonally positioned grounding vias 402 that are located between two adjacent differential channels. Inserted in this way, each adjacent pair of vias 402 and vias 400 in the regular array pattern may be separated by a given distance, where shielding via 410 is separated from at least some of vias 402 by a distance that is less than the given distance.

Figure 7:
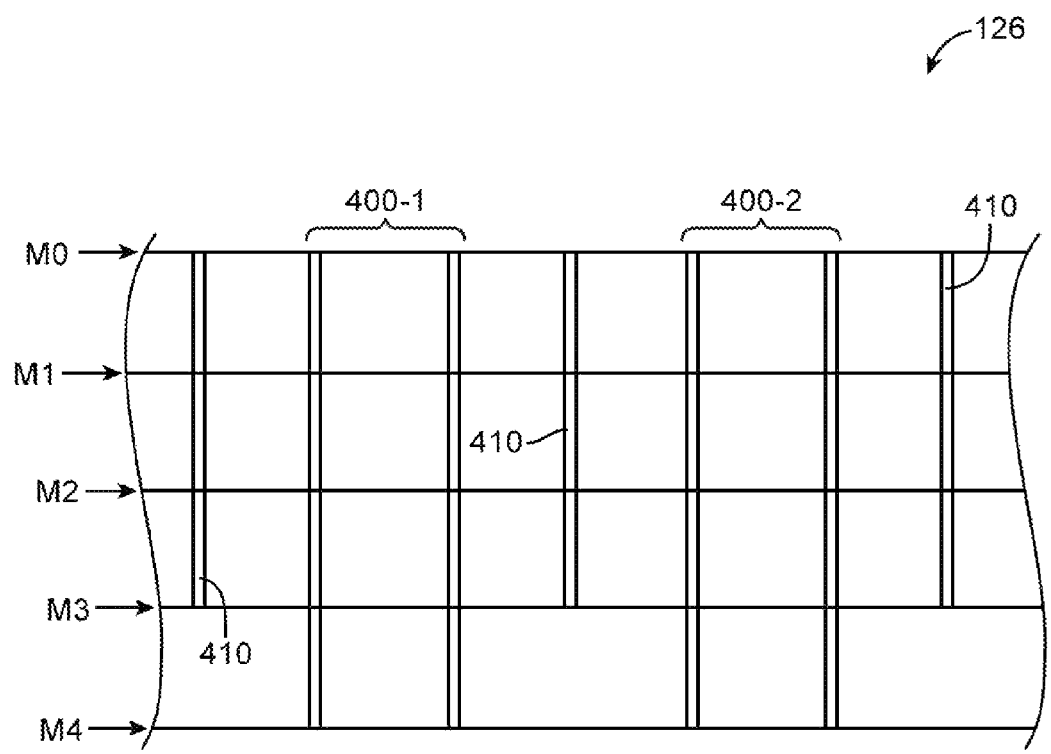
FIG. 7 is a cross-sectional side view showing how the inserted ground isolation vias does not impact PCB routing in accordance with an embodiment of the present invention.

FIG. 7 shows a cross-sectional side view of PCB substrate 126. PCB 126 may include routing layer M0 (e.g., a topmost routing layer that directly contacts solder balls 124), intermediate routing layers M1, M2, M3, and routing layer M4 (e.g., a bottom routing layer for routing signals to other locations on PCB 126). As an example shown in FIG. 7, the signal routing vias such as via structures 400-1 and 400-2 in FIG. 6 extend from M0 all the way down to M4, whereas the additional shielding vias 410 only extend from M0 to M3 (e.g., the signal routing vias may traverse a first number of routing layers, whereas the shielding vias may traverse a second number of routing layers that is different or less than the first number). Configured in this way, via structures 410 provide an optimum amount of isolation for crosstalk reduction without interfering with the PCB signal routing (which can be performed in layer M4, as an example).

Although the embodiments described here refer to a single-chip package, the vertical routing arrangements described in connection with FIGS. 3 and 5-7 may also be applied to multi-chip packages having an interposer. The interposer may include a substrate through which through silicon vias (TSVs) are formed and redistribution layers through which differential signal pairs can be routed. The orthogonally intertwined routing formation may be applied when forming the interposer TSVs (as an example).

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit package, comprising:
   a first pair of conductive via structures that carries a first differential signal;
   a second pair of conductive via structures that carries a second differential signal, wherein the first and second pairs of conductive via structures are orthogonally intertwined to form corners of a square-shaped region, wherein a given conductive via structure in the first pair and a given conductive via structure in the second pair are separated by a first distance and define a first line; and
   a plurality of ground via structures that surrounds the first and second pairs of conductive via structures, wherein two directly adjacent via structures in the plurality of ground via structures are separated by a second distance that is different than the first distance, and wherein the two directly adjacent via structures in the plurality of ground via structures define a second line that is parallel to the first line.

2. The integrated circuit package defined in claim 1, further comprising:
   a core layer, wherein the first and second pairs of conductive via structures comprise plated through hole (PTH) structures formed through the core layer.

3. The integrated circuit package defined in claim 2, wherein the core layer has a top surface and a bottom surface, the integrated circuit package further comprising:
   first dielectric layers formed on the top surface of the core layer; and
   second dielectric layers formed on the bottom surface of the core layer.

4. The integrated circuit package defined in claim 3, further comprising:
   an integrated circuit mounted on the first dielectric layers; and
   solder balls formed on the second dielectric layers.

5. The integrated circuit package defined in claim 1, wherein the conductive via structures in the first pair are separated from each other by a given distance, wherein the conductive via structures in the second pair are separated from each other by the given distance, and wherein the given distance is greater than the first distance.

6. Apparatus, comprising:
   a printed circuit board;
   an integrated circuit package mounted on the printed circuit board; and
   a plurality of solder balls formed between the integrated circuit package and the printed circuit board, wherein the printed circuit board comprises:
   first conductive vias carrying a first user signal;
   second conductive vias carrying a second user signal;
   third conductive vias surrounding the first conductive vias, wherein each of the third conductive vias serves as a return path for the first user signal and is aligned to a corresponding one of the plurality of solder balls; and
   at least one conductive via that is offset from the plurality of solder balls and that is interposed between the first conductive vias and the second conductive vias to electrically isolate the first conductive vias from the second conductive vias, wherein the at least one conductive via is electrically shorted to some of the third conductive vias.

7. The apparatus defined in claim 6, wherein the first conductive vias comprise vias for conveying a first differential signal, and wherein the second conductive vias comprise vias for conveying a second differential signal.

8. The apparatus defined in claim 6, wherein the plurality of solder balls is formed in a regular array pattern, wherein each adjacent pair of solder balls in the array is separated by a given distance, and wherein the at least one conductive via is separated from the third conductive vias by a distance that is less than the given distance.

9. The apparatus defined in claim 6, wherein the printed circuit board further comprises a plurality of dielectric layers, wherein the first conductive vias traverse a first number of dielectric layers in the plurality of dielectric layers, and wherein the at least one conductive via traverses a second number of dielectric layers in the plurality of dielectric layers that is different than the first number.

10. The apparatus defined in claim 9, wherein the second number of dielectric layers through which the at least one conductive via traverses is less than the first number.

11. The apparatus defined in claim 6, wherein the first and second conductive vias make direct vertical contact with corresponding solder balls in the plurality of solder balls, and wherein the at least one conductive via does not make direct vertical contact with any solder balls.

\* \* \* \* \*